United States Patent
O'Sullivan et al.

(10) Patent No.: US 12,439,616 B2
(45) Date of Patent: Oct. 7, 2025

(54) INTEGRATED CIRCUIT PACKAGE REDISTRIBUTION LAYERS WITH METAL-INSULATOR-METAL (MIM) CAPACITORS

(71) Applicant: Intel Corporation, Santa Clara, CA (US)

(72) Inventors: David O'Sullivan, Neubiberg (DE); Georg Seidemann, Landshut (DE); Bernd Waidhas, Pettendorf (DE); Horst Baumeister, Munich (DE)

(73) Assignee: Intel Corporation, Santa Clara, CA (US)

( * ) Notice: Subject to any disclaimer, the term of this patent is extended or adjusted under 35 U.S.C. 154(b) by 956 days.

(21) Appl. No.: 17/213,551

(22) Filed: Mar. 26, 2021

(65) Prior Publication Data

US 2022/0310777 A1     Sep. 29, 2022

(51) Int. Cl.
*H10D 1/68*     (2025.01)
*H01L 21/48*    (2006.01)
(Continued)

(52) U.S. Cl.
CPC ......... *H10D 1/692* (2025.01); *H01L 21/4857* (2013.01); *H01L 23/49816* (2013.01);
(Continued)

(58) Field of Classification Search
CPC ............... H01L 28/60; H01L 21/4857; H01L 23/49816; H01L 23/49894; H01L 24/16;
(Continued)

(56) References Cited

U.S. PATENT DOCUMENTS 9,576,933 B1    2/2017  Lo
10,461,146 B1 * 10/2019  Yeh .................... H01L 24/32
(Continued)

FOREIGN PATENT DOCUMENTS

JP   H0521710     1/1993
TW   201624650 A  7/2016
TW   202038414 A  10/2020

OTHER PUBLICATIONS

Extended European Search Report for European Patent Application No. 22158247.1, dated Aug. 17, 2022. 11 pgs.
(Continued)

*Primary Examiner* — Thanh T Nguyen
(74) *Attorney, Agent, or Firm* — Essential Patents Group, LLP

(57) ABSTRACT

IC chip package routing structures including a metal-insulator-metal (MIM) capacitor integrated with redistribution layers. An active side of an IC chip may be electrically coupled to the redistribution layers through first-level interconnects. The redistribution layers terminate at interfaces suitable for coupling a package to a host component through second-level interconnects. The MIM capacitor structure may comprise materials suitable for high temperature processing, for example of 350° C., or more. The MIM capacitor structure may therefore be fabricated over a host substrate using higher temperature processing. The redistribution layers and MIM capacitor may then be embedded within package dielectric material(s) using lower temperature processing. An IC chip may be attached to the package routing structure, and the package then separated from the host substrate for further assembly to a host component.

23 Claims, 17 Drawing Sheets

(51) Int. Cl.
    *H01L 23/00*       (2006.01)
    *H01L 23/498*    (2006.01)
    *H01L 25/00*       (2006.01)
    *H01L 25/065*    (2023.01)

(52) U.S. Cl.
    CPC ........ *H01L 23/49894* (2013.01); *H01L 24/16* (2013.01); *H01L 24/81* (2013.01); *H01L 25/0655* (2013.01); *H01L 25/50* (2013.01); *H01L 2224/16235* (2013.01)

(58) Field of Classification Search
    CPC ..... H01L 24/81; H01L 25/0655; H01L 25/50; H01L 2224/16235; H01L 21/561; H01L 21/568; H01L 23/3128; H01L 24/95; H01L 2221/68345; H01L 2224/13101; H01L 21/6835; H01L 24/97; H01L 2224/81001; H01L 2224/81801; H01L 2924/14; H01L 2924/15311; H01L 2924/181; H01L 23/49866; H01L 23/5383; H01L 23/49822; H01L 23/5223; H01L 21/76895; H01L 23/642; H01L 24/94; H01L 25/16; H01L 2221/68372; H01L 2224/94
See application file for complete search history.

(56) References Cited

U.S. PATENT DOCUMENTS

| | | | |
|---|---|---|---|
| 2006/0292815 A1* | 12/2006 | Roberts | H10D 1/68 257/E21.279 |
| 2007/0218626 A1 | 9/2007 | Lin et al. | |
| 2009/0140421 A1 | 6/2009 | Lin et al. | |
| 2010/0044089 A1 | 2/2010 | Shibuya et al. | |
| 2012/0161279 A1* | 6/2012 | Lin | H01L 23/3121 438/107 |
| 2017/0207147 A1* | 7/2017 | Liao | H10D 1/692 |
| 2017/0278921 A1 | 9/2017 | Chen et al. | |
| 2020/0006258 A1* | 1/2020 | Aleksov | H01L 23/49822 |
| 2020/0357760 A1 | 11/2020 | Chuang et al. | |
| 2020/0381398 A1 | 12/2020 | Lan et al. | |

OTHER PUBLICATIONS

Office Action from Taiwanese Patent Application No. 111105967 notified Jul. 3, 2025, 13 pgs.

* cited by examiner

INTEGRATED CIRCUIT PACKAGE REDISTRIBUTION LAYERS WITH METAL-INSULATOR-METAL (MIM) CAPACITORS

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical contacts suitable for further connecting to a host component, such as a printed circuit board (PCB). In the IC industry, the process of fabricating a package is often referred to as packaging, or assembly.

Capacitors are often needed for various electronic functions (e.g. in power delivery networks or filters, etc.). For some packages that include a silicon interposer to which an IC chip is interconnected (e.g., through first level interconnects), capacitors may be fabricated upon the silicon interposer. Alternatively, discrete capacitors may be attached to a package substrate within a keep-out-zone where no package interconnects are located. However, device packages are under pressure to reduce their form factor even though the complexity of their design continues to increase. For example, z-height (thickness) of a package is a very important characteristic, and in some device applications package z-heights of 0.3-0.4 mm, or less, are desired. Such thicknesses are difficult to achieve with silicon interposers or discrete capacitors. Package architectures that implement capacitors and offer a compact form factor are therefore commercially advantageous.

For high volume manufacturability, package processing often entails various types of packages (e.g. Flip Chip) made with wafer-level packaging (WLP) techniques where many chips are packaged in parallel while on a carrier or panel substrate. For example, in a s package, a chip is embedded into package dielectric material during a chip reconstitution process. Inputs/Outputs of the chip may then be redistributed to package interconnects with conductive routing features often referred to as redistribution layer (RDL) routing that may extend an arbitrary distance from an edge of the IC chip as supported by the package dielectric. However, many RDL technologies enlist organic dielectric materials that are limited to a maximum temperature (e.g., less than 350° C.) that hinders full integration of frontend wafer technology processes into the above mentioned packaging technologies.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
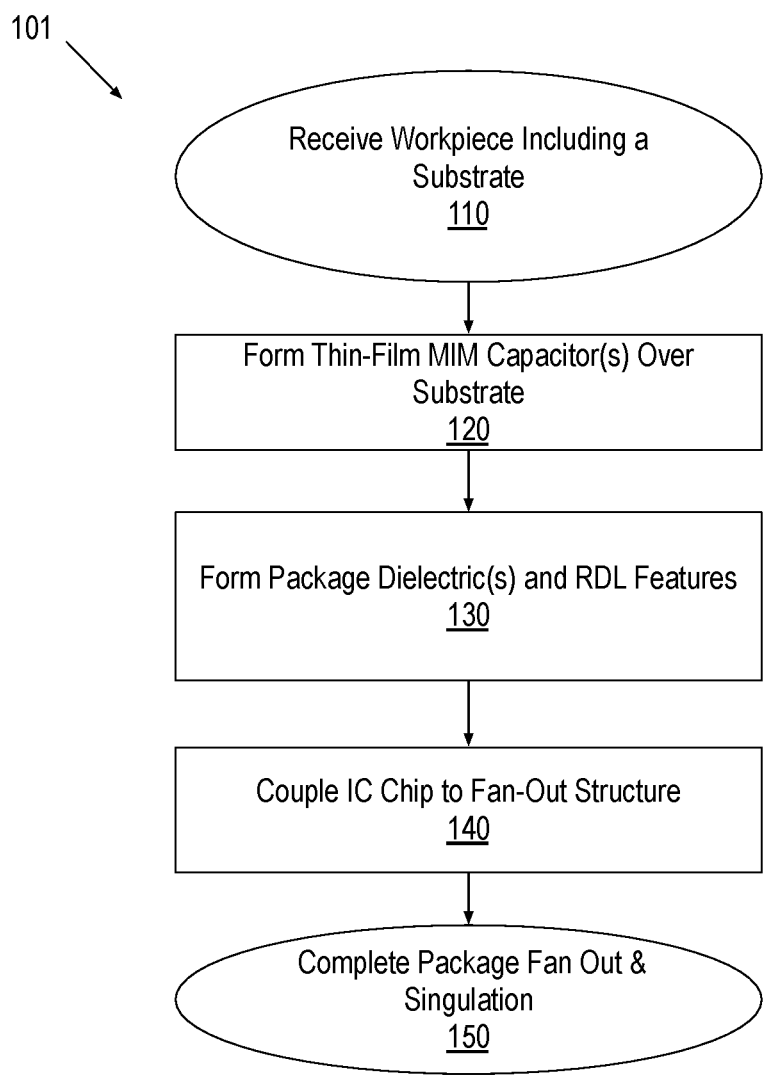
FIG. 1A is a flow diagram illustrating methods of fabricating package routing with integrated capacitors, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, IC packages include an IC chip coupled to an electrical routing structure that includes both redistribution layer (RDL) features and one or more metal-insulator-metal (MIM) capacitors. The MIM capacitor structures may be electrically coupled to the IC chip through some of the RDL features. In some examples, an active side of an IC chip is electrically coupled through RDL features that fan out to package interconnects that are to further couple the package to a host component, such as a circuit board, etc.

The MIM capacitors may be embedded within package dielectric with first RDL features on one side of the MIM capacitor structures, and second RDL features on another (opposite) side of the MIM capacitor structures. As further described below, the MIM capacitor structures may be fabricated early in a WLP flow with the use of thin film processing techniques that may leverage high temperatures, for example greater than 350° C. Subsequent to formation of the MIM capacitor structures, RDL features may be built up, along with package dielectric, to surround, and interconnect, the MIM capacitors into a larger electrical routing structure. IC chip may then be attached to a first side of the package routing structure, for example with "first-level" interconnects (FLI). As further described below, additional operations may then be performed once the IC chip is attached. For example, a second side of the package routing structure may be further processed with additional RDL features, which may terminate at interfaces that are to further couple the package routing to a host component, for example through "second-level" interconnect features.

FIG. 1A is a flow diagram illustrating methods 101 for fabricating a package routing with integrated MIM capacitor structures, in accordance with some embodiments. Methods 101 begin at block 110 with the receipt of a workpiece including a substrate suitable for thin film processing. In an exemplary embodiment, the workpiece is substantially planar and dimensioned in thickness and lateral area so as to be suitable support for panelized processing of multiple packages arrayed over the substrate (i.e., WLP). As further described below, the substrate may comprise one or more material layers. The various material layers of a substrate may be retained within a final singulated package, or separated from a final package as part of a sacrificial carrier.

Methods 101 continue with the fabrication of a package routing structure that includes both MIM capacitors and RDL features embedded within package dielectric. In advantageous embodiments, MIM capacitors are fabricated prior to the formation of package dielectric and RDL features. With such a sequence, the MIM capacitors may be freely fabricated with processes unconstrained by material limitations associated with the package dielectric and/or RDL features. For example, package dielectric may comprise a molding compound, spray-on dielectric, or dry film laminate material that may decompose at some temperature threshold that would otherwise constrain the structure and/or function of a MIM capacitor.

At block 120, a thin film MIM capacitor structure is formed over the substrate. Any number of additive or subtractive thin film processes may be practiced at block 120 to fabricate a capacitor structure that includes electrodes separated by an insulator of suitable layer thickness(es) and composition(s) for adequate capacitor performance. As described further below, block 120 may entail the deposition of both metal thin films and dielectric thin films. In some exemplary embodiments, one or more of these deposition processes are performed at a temperature of at least 350° C. Such high temperature processing may be advantageous for at least the capacitor insulator quality, for example enabling the deposition of a dielectric with desirable composition(s) and/or layer thickness(es). Block 120 may further entail one or more subtractive etch process where one or more of the thin films deposited at block 120 are patterned into individual capacitor structures.

With capacitor structures defined, fabrication of the routing structure may continue with relatively lower temperature processing (e.g., less than 400° C.). In the illustrated example, methods 101 continue at block 130 where electrically conductive RDL features are formed within one or more package dielectric materials built-up over the substrate and over a top of the capacitor structures. One or more of these RDL features may be coupled to one or more electrodes of the individual capacitor structures. Any number of levels of RDL features may be formed at block 130 with a top level terminating at features that are suitable for interconnecting with an IC die.

At block 140, one or more IC dies are coupled to the routing structure, for example with a FLI chip attachment process. With the chip attachment, one or more of the IC chips may be electrically coupled to one or more of the MIM capacitor structures through one or more of the RDL features of the routing structure. Once an IC chip is attached, one or more dielectric materials may be formed over a top of the IC chip and/or between the IC chips. For example, an overmold process, dry film lamination, or spin-on/spray-on dielectric process may be performed at block 140 to at least partially encapsulate the IC chip within the package.

Methods 101 end at output 150 where package routing is completed in any manner that facilitates a further coupling of the package to a host component. In some exemplary embodiments described further below, one or more material layers of the substrate are removed from the WLP workpiece and additional RDL features are formed on a side of the package routing structure opposite the IC die. Such RDL features may terminate at an interface suitable for interconnecting the package to a host component. One or more of these RDL features may also couple to one or more of the MIM capacitors and/or may couple to one or more of the RDL features formed at block 130. Following completion of the package, the workpiece may be singulated from the panel or wafer to generate singular IC device packages that include the MIM capacitors integrated within their conductive routing structure.

Figure 1B:
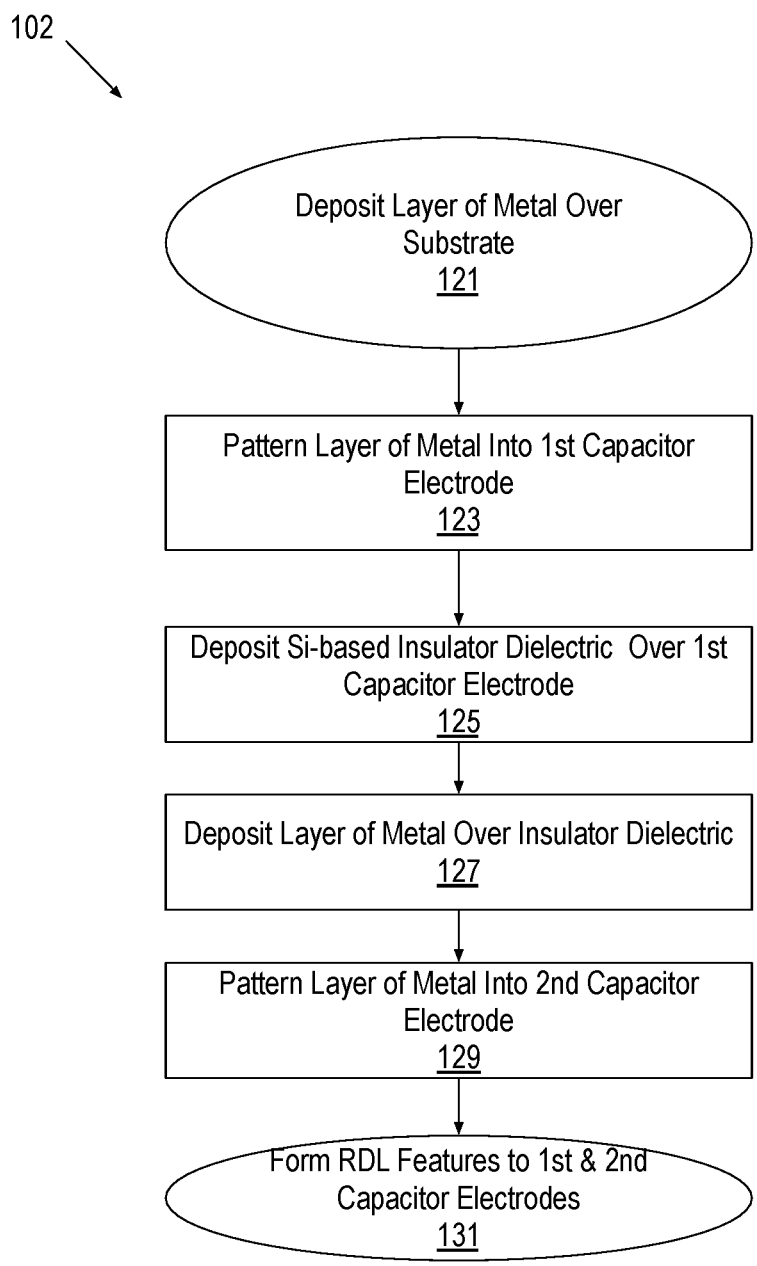
FIG. 1B is a flow diagram illustrating methods of fabricating a thin-film metal-insulator-metal (MIM) capacitor structure, in accordance with some embodiments.

A variety of techniques may be employed within methods 101 to form the MIM capacitor structures at block 120 because the early MIM fabrication can avoid various constraints, such as maximum temperature thresholds, associated with the subsequent blocks 130-140. FIG. 1B illustrates a flow diagram illustrating methods 102 for fabricating a thin-film metal-insulator-metal (MIM) capacitor structure, in accordance with some embodiments. Methods 102 may be practiced, for example, at block 120 of methods 101. However, methods 102 may be practiced in methods other than methods 101. Similarly, methods 101 need not necessarily include the practice of methods 102. FIGS. 2A, 2B, 2C, 2D and 2E illustrate cross-sectional views through a WLP workpiece as selected operations of a MIM capacitor fabrication method is performed, for example in accordance with some embodiments of methods 102.

Referring first to FIG. 1B, methods 102 begin at input 121 where one or more thin film layers of metal are deposited onto a work surface of the substrate. In exemplary embodiments, one electrode of a MIM capacitor is to be formed from the metal deposited at input 121. The thin film layer(s) deposited at input 121 may therefore have any composition (s), microstructure(s), and thickness(es) known to be suitable for a MIM capacitor electrode. For example, any of the metal layer(s) that may be deposited in the fabrication of a MIM capacitor that might be monolithically integrated into a CMOS IC chip or a silicon interposer may be practiced at input 121. Hence, at input 121 the WLP workpiece is ideally suitable for processing through any equipment and/or deposition processes that might be employed in a wafer fab. In some examples, the metal layer is deposited with one or more of a physical vapor deposition (PVD), chemical vapor deposition (CVD), plasma enhanced CVD (PECVD), ion beam deposition (IBD), or atomic layer deposition (ALD). Plating techniques (e.g., electroless or electrolytic) may also be practiced to deposit one or more metal films at input 121.

The composition of the metal(s) deposited at input 121 is advantageously amenable to being subtractively patterned with one or more etch processes. Hence, the metal is advantageously other than predominantly copper (Cu), which can be challenging to etch. In some examples, a metal of predominantly aluminum (Al), cobalt (Co), nickel (Ni), tungsten (W), tantalum (Ta), titanium (Ti), ruthenium (Ru), manganese (Mn), or platinum (Pt) is deposited at input 121. In some exemplary Al embodiments, the Al is alloyed with one or more other metals, such as Cu (e.g., ~0.5 wt %). In other embodiments, a nitride, carbide, or silicide of any of the above metals may be formed at input 121. The metal deposited at input 121 may be of any suitable thickness, for example ranging from a few tens of nanometers to a micron, or more.

Methods 102 continue at block 123 where the metal(s) deposited at input 121 is etched into a first electrode of individual MIM capacitor structures. Any masking and lithographic patterning process(es) may be employed at block 123. As one example, a photoresist may be applied to the planar metallized work surface of the substrate. The photoresist may be imaged to define masked and unmasked (open) regions over the thin film metal layer(s). An etch process suitable for the composition of the metal layer(s) may then be practiced to etch through the thin film metal layer(s) within open regions of the mask. Any etch process, such as a plasma RIE process or wet chemical etch process, can be performed at block 123.

Figure 2A:
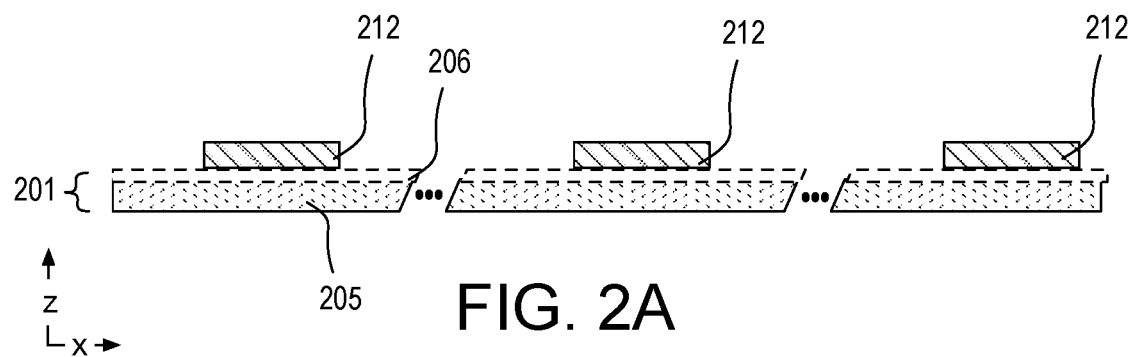
FIGS. 2A, 2B, 2C, 2D and 2E illustrate cross-sectional views through a WLP workpiece as selected operations of a MIM capacitor fabrication process is performed, in accordance with some embodiments.

FIG. 2A further illustrates a cross-sectional view of exemplary embodiments where a WLP workpiece 201 includes a carrier 205. Carrier 205 may be of any material(s) known to be suitable for WLP techniques. In exemplary embodiments, carrier 205 is sacrificial in the sense that it is not retained as a permanent feature of an IC device package. In some embodiments, carrier 205 is a metal preform, for example of stainless steel, or other metallic sheet good. In other embodiments, carrier 205 is a semi-conductive/insulative crystalline material, such as silicon, (e.g., a large format silicon wafer). In other embodiments, carrier 205 is glass, sapphire, quartz, or the like. In still other embodiments, carrier 205 is a ceramic or polymeric material. Carrier 205 may also be a laminate or hybrid comprising multiple material layers.

One or more interface layers 206 may be on a surface of carrier 205. Interface layers 206 are illustrated in dashed line to emphasize the number of interface layers 206 may vary. For some embodiments, interface layers 206 are to function as release layers that facilitate subsequent removal of carrier 205. Interface layers 206 may be sacrificial, but can also be retained as permanent features of an IC device package. In some examples, interface layers 206 include one or more silicon layers. Such silicon layers may be substantially single crystalline, for example. In addition to such silicon layers, or in the alternative to such silicon layers, interface layers 206 may include a silicon dioxide ($SiO_2$) layer and/or a silicon nitride ($Si_3N_4$) layer, and/or a silicon oxynitride ($SiO_xN_y$) layer.

As further illustrated in FIG. 2A, a first capacitor electrode 212 has been patterned from a metal film (e.g., Al, etc.). As represented by ellipses, any number of capacitor electrodes 212 may be arrayed over a WLP workpiece with each individual capacitor electrode 212 defined from a metal film by a dry/REI plasma or wet chemical etch process, for example. In the exemplary embodiment, the metal etch process stops on interface layers 206.

Returning to FIG. 1B, methods 102 continue at block 125 where a capacitor insulator is deposited. The capacitor insulator deposited at block 125 is advantageously silicon-based (i.e., comprising silicon) and may further include at least one of oxygen (SiO) or nitrogen (SiN). In some embodiments, a single dielectric material layer is deposited at block 125. In other embodiments, a multi-layered stack of dielectric materials is deposited at block 125. One example of a multi-layered stack such is a SiO—SiN—SiO (ONO) stack with each layer comprising predominantly silicon and one of either oxygen or nitrogen. Silicon-based dielectric materials may be deposited by one or more of CVD or PECVD, for example. Such deposition techniques are known to produce excellent insulator layers with thicknesses that can be readily controlled to within a few nanometers of wafer-level uniformity. To achieve good insulator quality (e.g., low electrical leakage, high break down voltage, etc.) and uniformity, CVD and PECVD techniques may entail elevated processing temperatures, for example of 450° C., or more.

Other dielectric materials known to be suitable as an insulator in a MIM capacitor structure may also be deposited at block 125. For example, a high-k dielectric material having a relative permittivity exceeding 9 may be deposited at block 125. In some embodiments, a metal oxide, such as hafnium oxide ($HfO_x$) or aluminum oxide ($AlO_x$), may be deposited at block 125, for example with an ALD process. Such ALD processes may also enlist elevated temperatures (e.g., 350° C., or more).

Although block 125 is illustrated to follow a patterning of the first electrode at block 123, multiple thin films including one or more metal thin films and one or more dielectric thin films may be deposited as a MIM capacitor stack before any patterning of the MIM capacitor structure is performed. Such a stack may then be patterned according to one or more masks and etch processes. Hence, methods 102 need not be practiced strictly according to the exemplary order of the blocks illustrated in FIG. 1B.

Figure 2B:
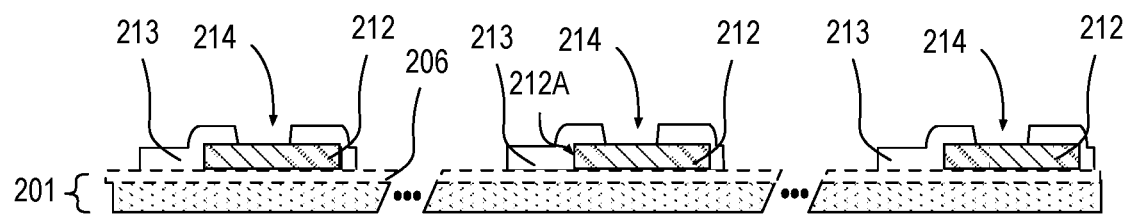

For embodiments where a first MIM capacitor electrode is patterned prior to the subsequent deposition of one or more dielectric materials, the dielectric materials may be deposited onto an entirety of the electrode, or onto only a portion of the electrode. FIG. 2B illustrates one example where a dielectric material 213 is deposited over electrode 212, and then patterned to have openings 214 that expose a portion of electrode 212. Dielectric material 213 may, for example, provide electrical isolation, reducing electrical leakage between electrode 212 and a second electrode of the MIM capacitor. Dielectric material 213 may be a conformally deposited silicon-based thin film dielectric, for example. Suitable silicon-based dielectric materials include $SiO_2$ and carbon-doped silicon dioxide (CDO). Relative to a package dielectric material, such as a mold compound, dry film laminate, or other package build up material, electrodes of a MIM capacitor may be better isolated by such silicon-based thin film materials.

In the example shown in FIG. 2B, dielectric material 213 is in direct contact with a previously patterned electrode edge sidewall 212A. Dielectric material 213 may completely encircle a perimeter of electrode 212. Dielectric material 213 is subtractively patterned, for example by practicing any suitable lithographic masking and dielectric etch process(es) to define openings 214 of a predetermined area suitable for a desired electrical capacitance. In this example the dielectric etch process again stops on interface layers 206.

Figure 2C:
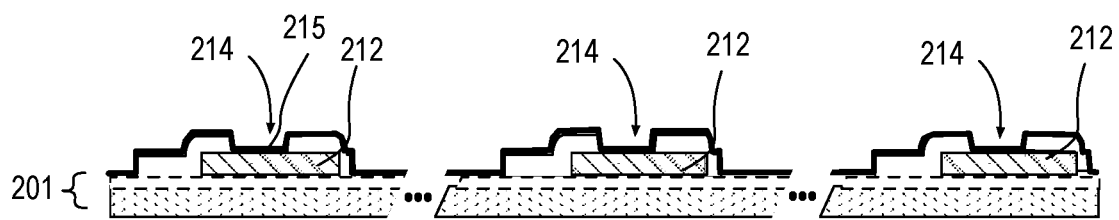

As further illustrated in FIG. 2C, capacitor insulator 215 is conformally deposited over dielectric material 213, and into openings 214 to directly contact a portion of electrode 212. Capacitor insulator 215 may be an ONO stack, for example. Alternatively, insulator 215 may comprise one or more alternative silicon-based dielectric materials, or metal-oxide materials, such as any of those described above.

Returning to FIG. 1B, methods 102 continue at block 127 where one or more additional metal layers are deposited over the capacitor insulator to complete the MIM material stack. The composition, microstructure, and thickness of the metal layer(s) deposited at block 127 may vary widely. In some exemplary embodiments, the metal layer(s) deposited at block 127 is substantially the same as that deposited at block 123. For example, where a metal film of predominantly Al is deposited at block 123, substantially the same metal film of predominantly Al is also deposited at block 127. At block 129, the metal film deposited at block 127 may be etched into another electrode of the MIM capacitor structure. Hence, the metal deposited at block 129 is advantageously amenable to the etch process (e.g., dry/RIE plasma etch or wet chemical etch) performed at block 127.

Figure 2D:
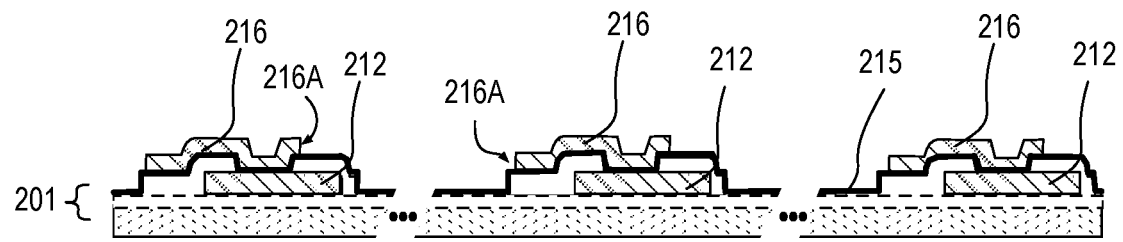

FIG. 2D illustrates an exemplary patterning of a metal film into a MIM electrode 216. In this example, an etch process practiced to pattern MIM electrode 216 is stopped on capacitor insulator 215. Portions of capacitor insulator 215 beyond electrode edge sidewall 216A may therefore be retained as a permanent feature of a device package. Alternatively, capacitor insulator 215 may be patterned in substantial alignment with electrode edge sidewall 216A, for example during an overetch of MIM electrode 216.

Figure 2E:
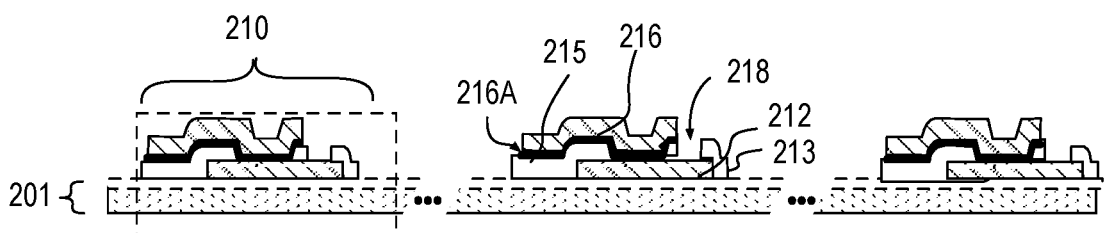

Returning to FIG. 1B, methods 102 complete at output 131 where the MIM capacitor structure is prepared for subsequently formed package RDL features that are to electrically couple to one or more of the MIM capacitor electrodes. For example, one or more dielectric materials may be deposited over the MIM capacitor electrodes and/or one or more dielectric materials over the MIM capacitor electrodes may be patterned to expose a portion of the electrodes that are to be contacted by an RDL feature. For the embodiment illustrated in FIG. 2E, an opening 218 is etched through dielectric material 213 to expose a contact region of electrode 212. Any photolithographic masking and dielectric etch process may be enlisted to form opening 218. FIG. 2E further illustrates an example where capacitor insulator 215 is patterned to be substantially coincident with electrode edge sidewall 216A with the etch process(es) stopping on interface layers 206.

Figure 3A:
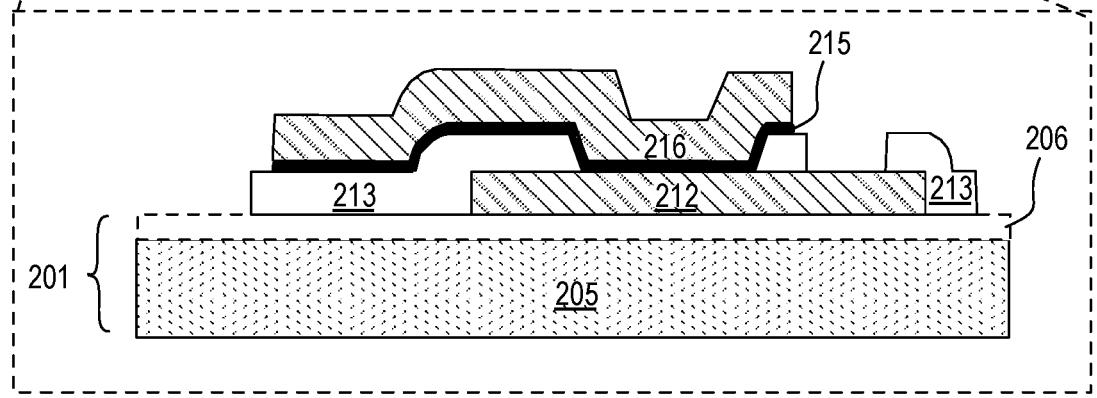
FIG. 3A is an expanded cross-sectional view of the MIM capacitor introduced in FIG. 2E, in accordance with some embodiments.
Figure 3B:
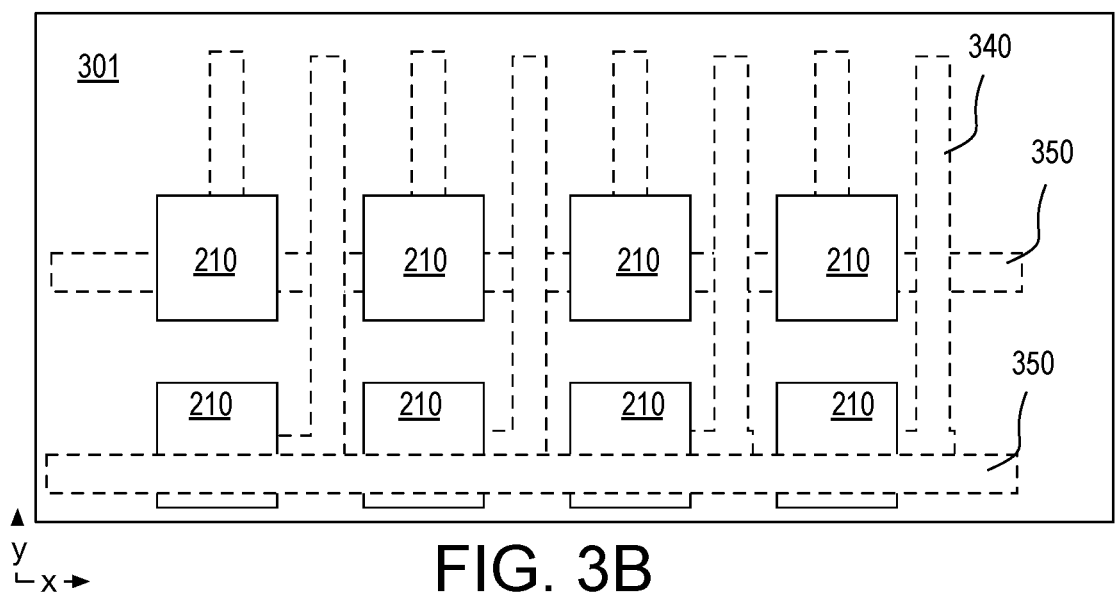
FIG. 3B is a top-down plan view of a plurality of MIM capacitors, in accordance with some embodiments.

FIG. 3A is an expanded cross-sectional view of MIM capacitor 210 introduced in FIG. 2E, in accordance with some embodiments. As shown, MIM capacitor 210 is substantially complete and WLP methods 101 may be continued at block 130, for example, to complete a device package. FIG. 3B is a top-down plan view of a plurality of MIM capacitors 210, in accordance with some embodiments. As shown, MIM capacitors 210 are arranged into a 2D spatial array within the footprint of one IC device package 301. Although not yet present (as denoted by dashed line), first RDL conductive routing features 340 may be electrically connected to first electrodes of each MIM capacitor 210 within the bank of MIM capacitors 210. Second RDL conductive routing features 350 may be electrically connected to second electrodes of each MIM capacitor 210. At least one of the first or second RDL conductive routing features 340, 350 may be coupled to a fuse so that various fuses within a fuse bank may be blown to include one or more MIM capacitor 210 within particular IC die-RDL circuitry.

Figure 4A:
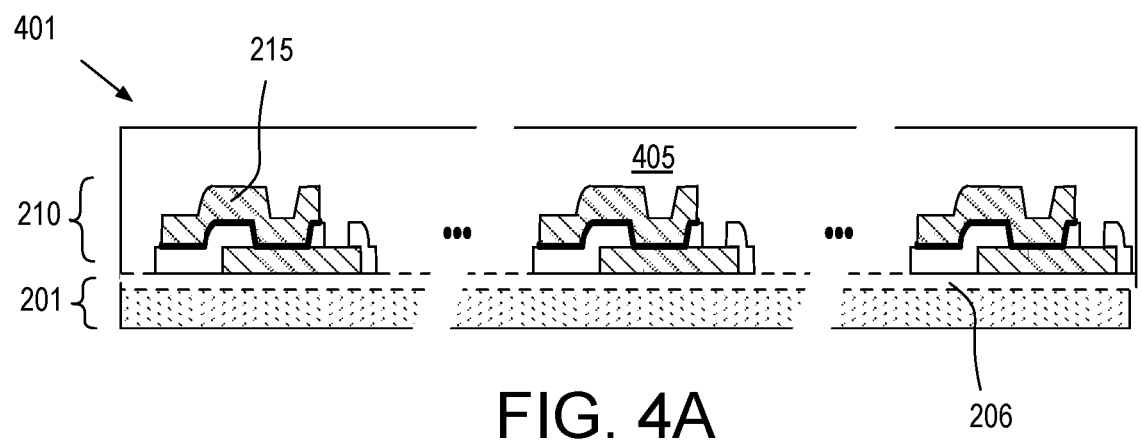
FIGS. 4A, 4B, 4C and 4D illustrate cross-sectional views through a WLP workpiece as selected operations of a WLP process is performed to form redistribution layer (RDL) features on a first side of a MIM capacitor structure, in accordance with some embodiments.

FIGS. 4A, 4B, 4C and 4D illustrate cross-sectional views through a WLP workpiece as selected operations are performed to form a package routing structure 401 that includes redistribution layer RDL features on a first side of MIM capacitor structure 210. The processing illustrated in FIG. 4A-4D may be performed on a wafer-level, for example immediately following the formation of MIM capacitor structures. As shown in FIG. 4A, the workpiece includes MIM capacitor 210, substantially as described above. A package dielectric 405 is formed over each MIM capacitor 210. MIM capacitors 210 are at least partially embedded within package dielectric 405. For example, in some embodiments, a sidewall of at least one MIM capacitor electrode (e.g., electrode 215) is at least partially covered by package dielectric 405, for example by the molding or lamination process.

Package dielectric 405 is advantageously other than a silicon-based material, such as, an epoxy resin, phenolic-glass, or a resinous film such as the GX-series films commercially available from Ajinomoto Fine-Techno Co., Inc.). Package dielectric 405 may comprise epoxy resins (e.g., an acrylate of novolac such as epoxy phenol novolacs (EPN) or epoxy cresol novolacs (ECN)). In some specific examples, package dielectric 405 is a bisphenol-A epoxy resin, for example including epichlorohydrin. In other examples, package dielectric 405 includes bisphenol-F epoxy resin (with epichlorohydrin). In other examples, package dielectric 405 includes aliphatic epoxy resin, which may be monofunctional (e.g. dodecanol glycidyl ether), difunctional (butanediol diglycidyl ether), or have higher functionality (e.g. trimethylolpropane triglycidyl ether). In still other examples, package dielectric 405 includes glycidylamine epoxy resin, such as triglycidyl-p-aminophenol (functionality 3) and N,N,N',N'-tetraglycidyl-bis-(4-aminophenyl)-methane (functionality 4). Although such polymeric materials may decompose at high processing temperatures and may not offer the same electrical properties as a silicon-based dielectric utilized in the MIM capacitor insulator, these materials may instead offer a number of advantages associated with semi-additive build-up techniques. Depending on the embodiment, package dielectric 405 may be any of a molding compound, a spin-on material, or dry film laminate material, for example. Package dielectric 405 may be introduced wet/uncured into a cast and then dried/cured. Alternatively, package dielectric 405 may be introduced as a semi-cured dry film that is deformed around MIM capacitors 210, and then fully cured.

Figure 4B:
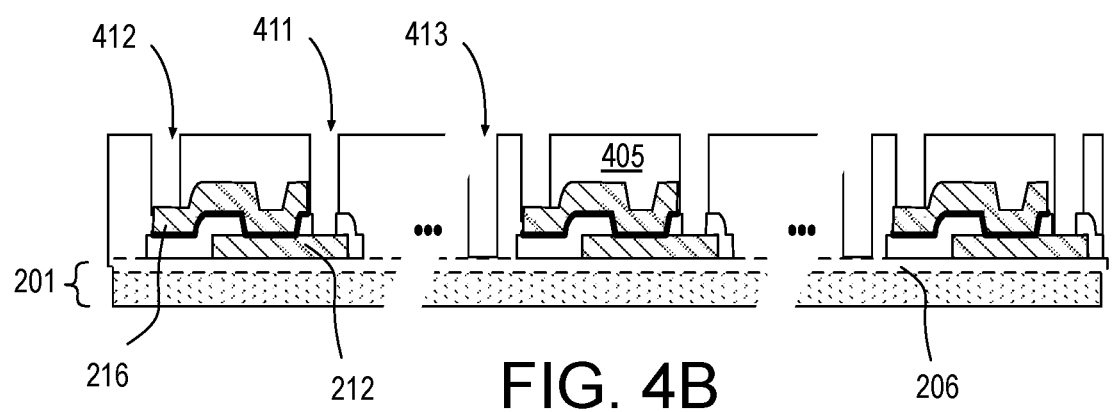

FIG. 4B further illustrates a package routing structure 401 following the formation of an opening 411 through package dielectric 405 that exposes a portion of MIM capacitor electrode 212. Another opening 412 has likewise been formed into package dielectric 405 to similarly expose a portion of MIM capacitor electrode 216. Additional openings 413 may be formed through package dielectric 405 within a fan-out region adjacent to MIM capacitor 210, for example exposing regions of interface layers 206. Any technique suitable for the particular composition of package dielectric 405 may be employed to form openings 411, 412, 413. For embodiments where package dielectric 405 is photosensitive, a lithographic process may directly pattern package dielectric 405. Alternatively, a photolithographic masking process may be performed and package dielectric 405 etched according to the mask. In other embodiments, openings 411, 412, 413 may be ablated, for example with a laser. For openings 413, the via opening may stop on interface layer 206.

Figure 4C:
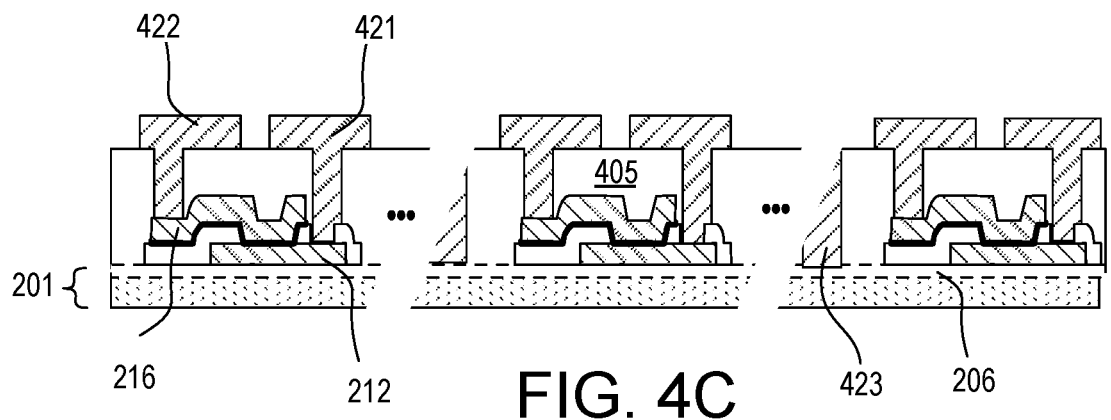
Figure 4D:
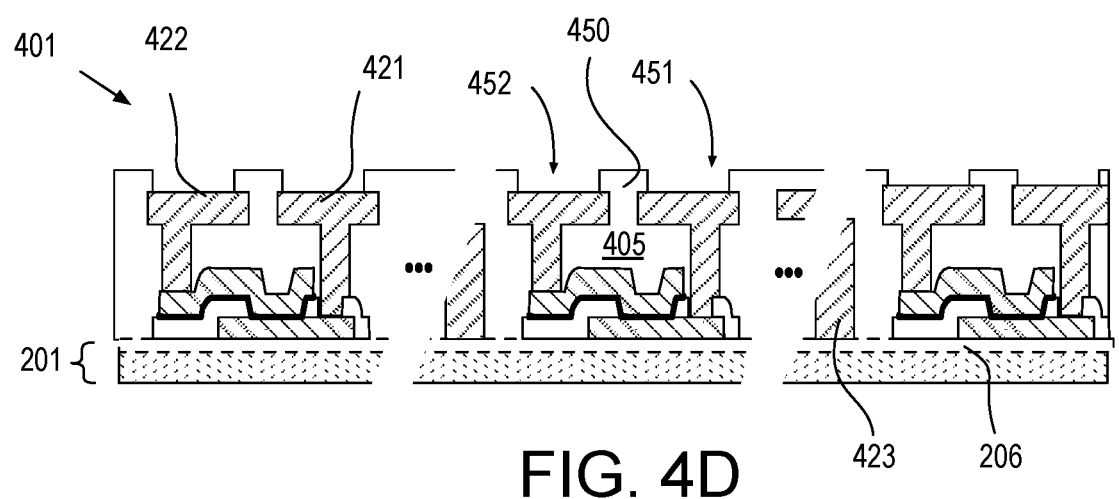

FIG. 4C further illustrates a package routing structure following the formation of a conductive RDL feature 421 backfilling opening 411, a conductive RDL feature 422 backfilling opening 412, and a conductive RDL feature 423 backfilling opening 413. Any other openings within package dielectric 405 may be similarly filled with a conductive feature. In the illustrated example, RDL feature 421 is in direct contact with electrode 212 while RDL feature 422 is in direct contact with electrode 216. RDL feature 423 is unlanded at this point, and may be subsequently coupled to another RDL feature or under-bump metallization, as described further below. Conductive RDL features 421, 422, 423 may be formed with an additive or semi-additive process, for example. In some embodiments, RDL features 421, 422, 423 are formed by first depositing a seed layer (e.g., Cu) and then forming a plating resist mask (not depicted) over the seed layer. With an electrolytic deposition process, Cu is plated upon the seed layer wherever the resist mask is absent. Accordingly, RDL features 421, 422, 423 may have substantially the same composition (e.g., predominantly Cu). RDL features 421, 422, 423 may therefore have a composition, microstructure, and/or thickness that is significantly different than the subtractively patterned MIM capacitor electrodes 212, 216. Following the plating process, the plating resist and seed layer may be stripped to arrive at the structure illustrated in FIG. 4C.

Another package dielectric 450 may then be applied over RDL features 421, 422, 423. Package dielectric 450 may be substantially the same as package dielectric 405, for example. Alternatively, package dielectric 405 may have a first composition (e.g., predominantly a first polymer) while package dielectric 450 has a second composition (e.g., predominantly a second polymer). Openings 451, 452 may then be patterned into package dielectric 450, and another plating process performed to extend routing structure 401. A cycle including package dielectric application, patterning of the package dielectric, and plating of conductive features upon the patterned package dielectric may be repeated any number of times to build-up any number of levels of conductive redistribution layer features over a first side of a MIM capacitor structure within the routing structure.

Figure 5A:
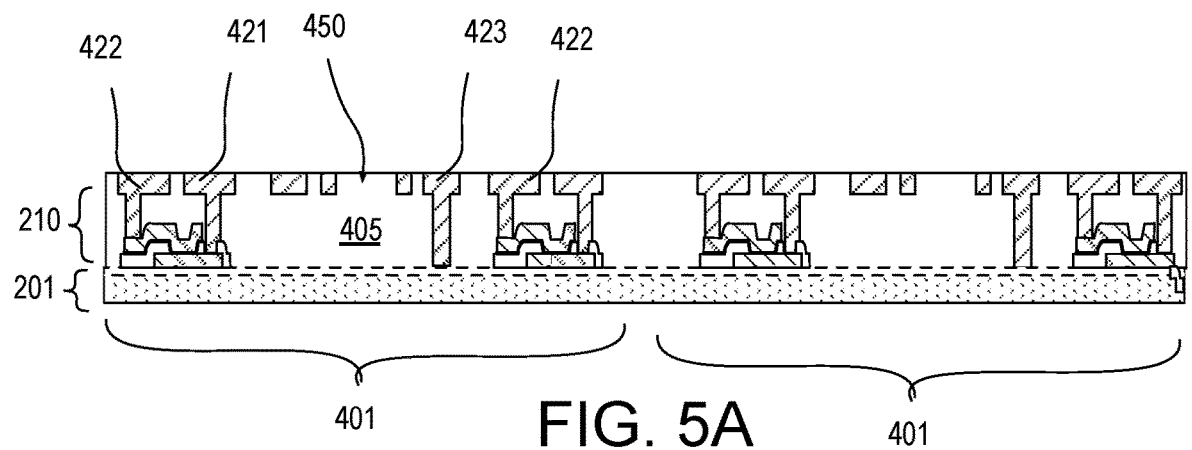
FIGS. 5A, 5B, 5C, and 5D illustrate cross-sectional views through a WLP workpiece as selected operations of a WLP process is performed to attach an IC chip to interconnect features on a first side of a MIM capacitor structure, in accordance with some embodiments.
Figure 5B:
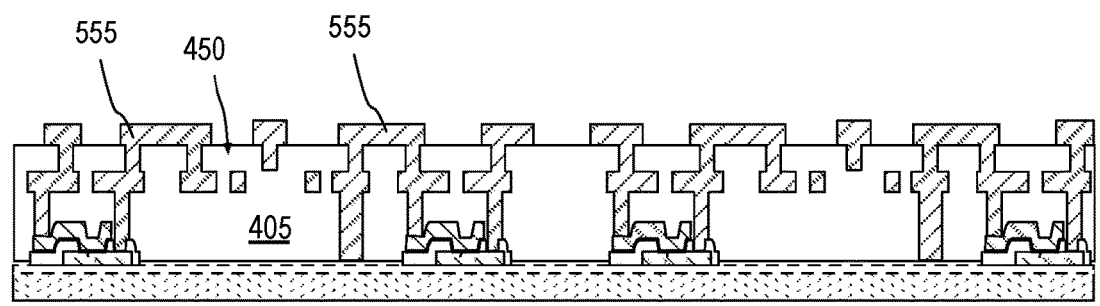

One or more IC chips may be attached to each package routing structure. FIGS. 5A, 5B, 5C, and 5D illustrate cross-sectional views through a portion of a workpiece including two laterally adjacent package routing structures 401 as selected operations of a WLP process is performed to attach IC chips to interconnect features on a first side of an integrated MIM capacitor structure. In the example shown in FIG. 5A, two MIM capacitor structures 210 are illustrated to emphasize that any number of MIM capacitors may be integrated into a single package routing structure. Conductive RDL features 423, 421 and 422 are extended through package dielectric 450 and package dielectric 405, and may be formed substantially as described above. FIG. 5B further illustrates the formation of additional package dielectric 450 and another layer of conductive RDL features 555, which are electrically coupled with lower level RLD features 421, 422, 423, for example. RLD features of package routing structure 401 terminate at FLI interfaces 515, which are to directly contact FLI 525 further illustrated in FIG. 5C.

Figure 5C:
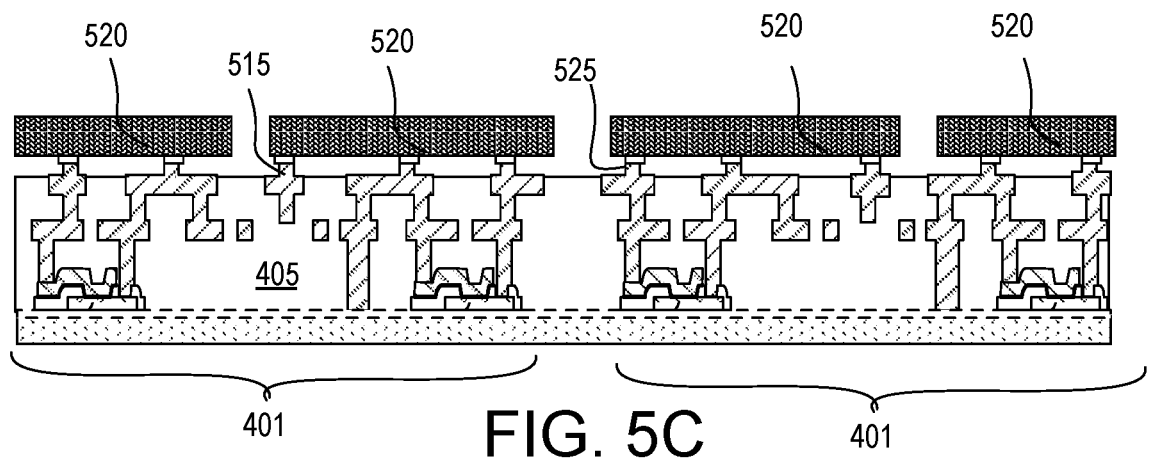

FIG. 5C illustrates attachment of an IC chip 520. In some embodiments, IC chip 520 includes microprocessor circuitry. The microprocessor circuitry may be operable, for example, to execute a real-time operative system (RTOS). In some further embodiments, IC chip 520 is operable to execute one or more layers of a software stack that controls radio (wireless) functions. In one exemplary embodiment, IC chip 520 includes a digital baseband processor, or baseband radio processor (BBP) suitable for use within a mobile phone, or other wireless/mobile device.

In the example depicted in FIG. 5C, two IC chips 520 are attached to each package routing structure 401. While such multi-chip package embodiments may be advantageous for a variety of applications, single-chip packages are also possible. Any technique known to be suitable for positioning an IC chip onto a package substrate may be employed. As one example, a pick-and-place machine may pick-and-place IC chips 520 onto the WLP workpiece. In some examples, FLI 525 comprises a solder feature. The solder features may be solder balls, for example, that may be attached according to any known process such as a controlled heat treatment that may partially reflow one or more of solder flux or a solder ball. Alternatively, the solder features may be studs, pillars or microbumps comprising a conductive material (e.g., solder paste). FLI 525 may further comprise one or more layer of under-bump metallization (UBM) that may, for example, include gold and/or nickel in direct contact with a terminal RDL feature 555.

Figure 5D:
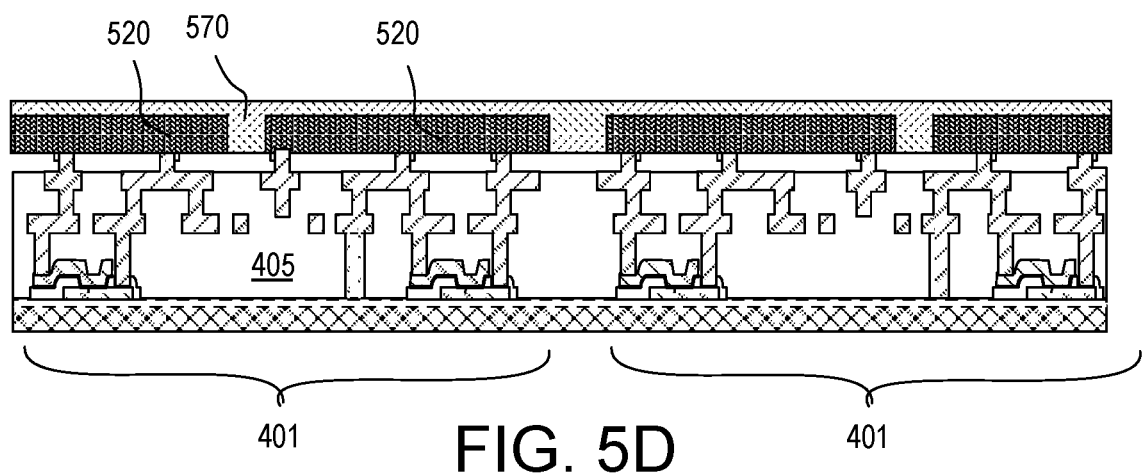

As further illustrated in FIG. 5D, a package dielectric 570 may be applied over IC chip 520 following the chip attach. Package dielectric 570 may have substantially the same composition as one or more of package dielectrics 405 and 450, or package dielectric 570 may have a composition that differs from one or more of package dielectrics 405 and 450. In some embodiments, package dielectric 570 is a mold compound applied, for example, with an overmold process. In the illustrated example, mold compound completely planarizes IC chip 520, filling spaces between adjacent IC chips 520. In other examples, mold compound may separately encapsulate individual ones of IC chips 520 with some portion of a package routing structure 401 exposed within spaces between individually overmolded IC die. In other embodiments, package dielectric 570 is a build-up dielectric applied, for example, with a dry film laminate process or a liquid application process (e.g., spin-on). For such embodiments, package dielectric 570 may substantially planarize IC chips 520 with dielectric 570 completely covering package routing structure 401 within spaces between adjacent IC chip 520, substantially as illustrated.

Figure 5E:
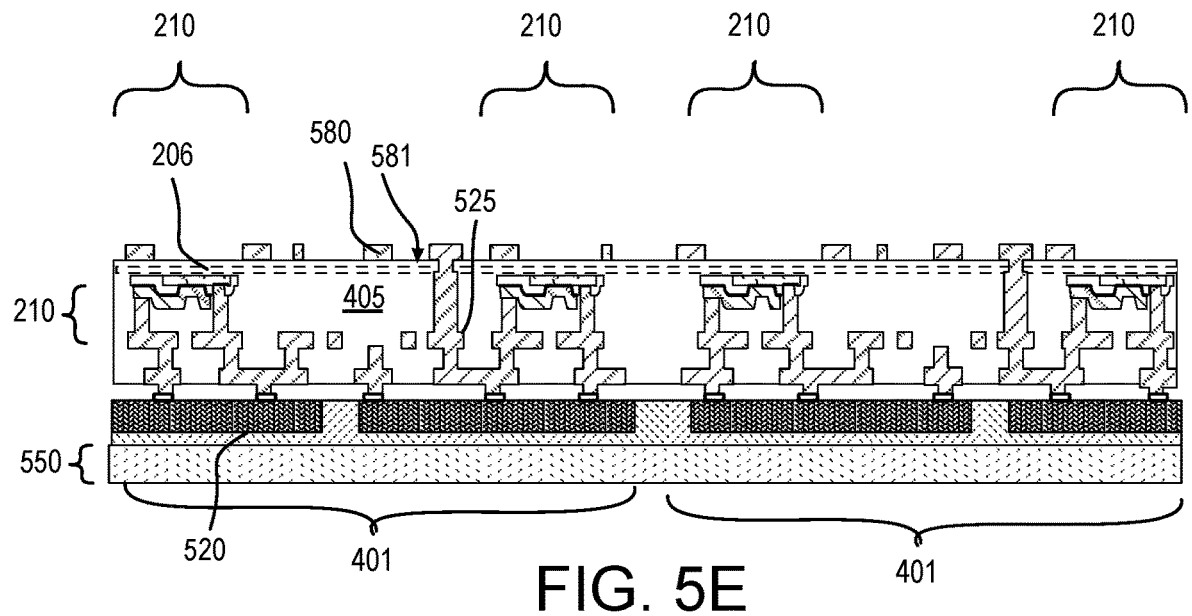
FIGS. 5E, 5F and 5G illustrate cross-sectional views through a WLP workpiece as selected operations of a WLP process is performed to form RDL features on a second side of a MIM capacitor structure, accordance with some embodiments.
Figure 5F:
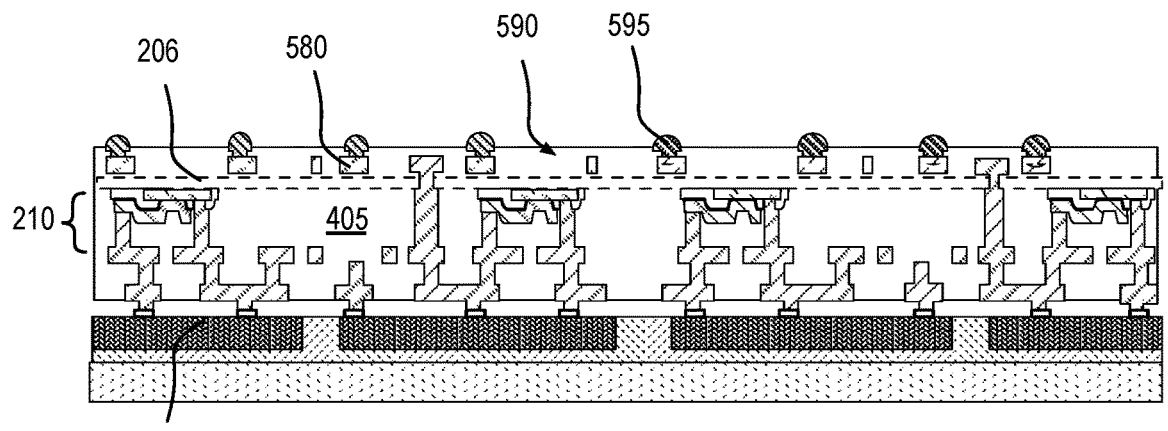
Figure 5G:
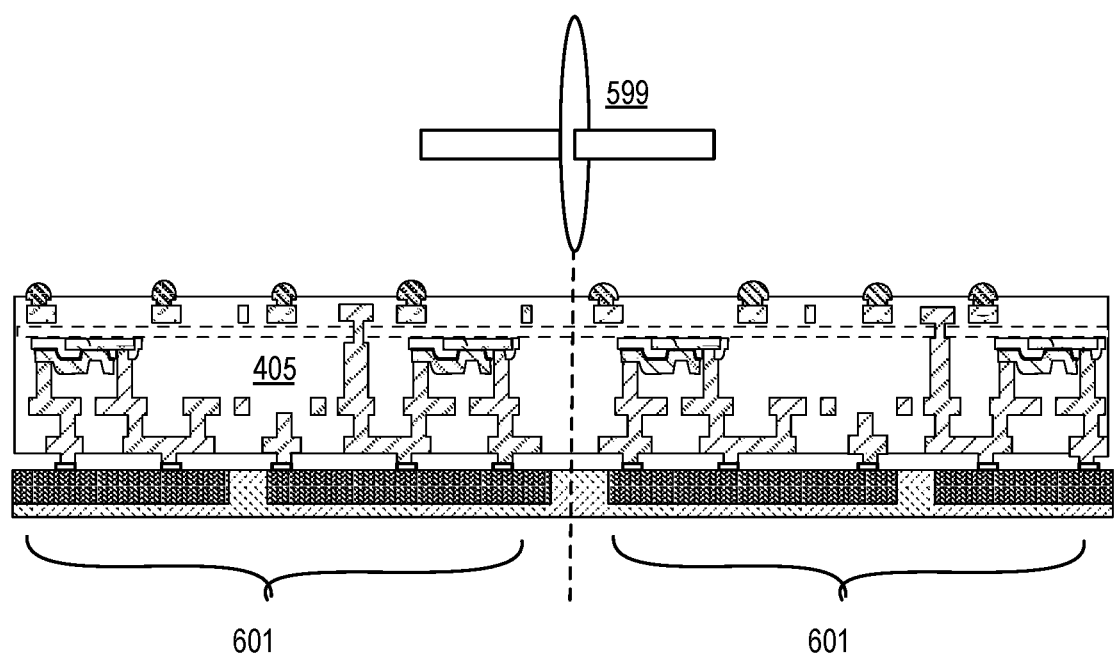

Following chip-attach, further wafer-level processing may be directed toward preparing the package for interconnection to a host component, such as a PCB or interposer through any suitable second level interconnect structure. In some exemplary embodiments, a side of the routing structure opposite the IC chip is further processed to form at least an interface to receive second level interconnects. Such processing may, for example, entail additional build-up of the package routing structure progressing away from a second side of the MIM capacitor structure. FIGS. 5E, 5F and 5G illustrate cross-sectional views through a workpiece as selected operations of a WLP process is performed to form RDL features on a second side of a MIM capacitor structure, accordance with some embodiments. Such processing, may for example, be performed at output 150 (FIG. 1A) as a last phase of a WLP process.

As shown in FIG. 5E, the WLP workpiece is mounted to a carrier 550. Either before or after carrier 550 is attached to the workpiece, carrier 201 is removed. One or more of interface layers 206 may also be removed from package routing structure 401. Interface layers 206 may be retained only within an area of MIM capacitors 210, for example having been previously patterned during an etch process employed to define a feature of MIM capacitors 210. In the example shown in FIG. 5E, interface layers 206 extend continuously over an entirety of routing structures 401. Any retained portion of interface layers 206 may be patterned with a masked etch process (e.g., dry/RIE plasma or wet chemical) to open regions where an RDL feature is to enter into package dielectric 405 and/or make contact with another RDL feature embedded within package dielectric 405. Optionally, interface layers 206 may be completely stripped off to fully expose MIM capacitor electrode 212 and/or package dielectric 450, etc.

Carrier 550 may include one or more materials, such as any of the examples provided above for carrier 201. Although not illustrated, carrier 550 may be attached with any suitable interface material, and may further include one or more sacrificial release material layers, etc. With carrier 201 removed, WLP processing proceeds with additional RDL that may fan out from the RDL features previously fabricated and/or from one or more electrodes of MIM capacitors 210. In the example shown in FIG. 5E, host-side RDL features 580 have been formed on a surface of package dielectric 405. RDL features 580 may be formed, for example, with a masked plating process. RDL features 580 may therefore have substantially the same composition as die-side RDL features (e.g., 525). MIM capacitor electrodes 212, 216 may therefore have a different composition as RDL features on opposite sides of MIM capacitors 210. Such an architecture is indicative of a "capacitor-first" build-up of package routing structure 401.

One or more features (e.g., openings) may be patterned into package dielectric 405, for example with a photolithography process or laser ablation process performed on the host-side surface 581. For such embodiments, RDL features 580 may extend below host-side surface 581. One or more host-side RDL features 580 may therefore be in direct contact with one or more die-side RDL features 525. For example, patterning performed on host-side surface 581 may expose one or more conductive features that are coupled to IC chips 520 through the redistribution layer(s) within a fan-out region adjacent to an edge of a MIM capacitor 210. As described further below, RDL features 580 may also be in direct contact with MIM capacitor electrode 212, for example following patterning of interface layers 206.

As shown in FIG. 5F, another package dielectric 590 may be applied over RDL features 580. Package dielectric 590 may be substantially the same as package dielectric 405. Alternatively, package dielectric 405 may have a first composition (e.g., predominantly a first polymer) while package dielectric 590 has a second composition (e.g., predominantly a second polymer). Openings may then be patterned into package dielectric 590, for example to expose SLI interfaces, upon which SLI 595 may be formed. Any number of package dielectric layers an conductive feature layers may be fabricated to build-up any number of levels of conductive redistribution layer features over the second side of MIM capacitors 210.

In some examples, SLI 595 comprises a solder feature. The solder features may be solder balls, etc. that may be attached according to any known process such as a controlled heat treatment that may partially reflow one or more of solder flux or a solder ball. Alternatively, the solder features may be studs, pillars, or microbumps comprising a conductive material (e.g., solder paste). SLI 595 may further comprise one or more layer of under-bump metallization (UBM) that may, for example, include gold and/or nickel in direct contact with an interfacing RDL feature 580.

FIG. 5G further illustrates a singulation process 599, which is to cut through the WLP workpiece between two laterally adjacent IC package routing structures to singulate individual IC packages 601. Singulation process 599 may be performed with any saw or laser ablation tool known to be suitable for singulation of IC packages.

FIG. 6A-6D are cross-sectional views through a WLP workpiece illustrating MIM capacitor interconnections, in accordance with some alternative embodiments. These examples further illustrate how MIM capacitor electrodes 212, 216 may be interconnected to RDL features from only one side of a package routing structure, or from multiple sides of a package routing structure. In the example shown in FIG. 6A, capacitor electrode 216 is coupled to an RDL feature 605 that extends through interface layers 206, as well as isolation dielectric 213, to couple MIM capacitor electrode 216 with SLI 595. RDL feature 605 may also pass through one or more layers of package dielectric (e.g., package dielectric 405 or 590). MIM capacitor electrode 216 is also coupled to IC chip 520 through RDL feature 422. In this example, only one RDL feature 421 is coupled to MIM capacitor electrode 212.

Figure 6A:
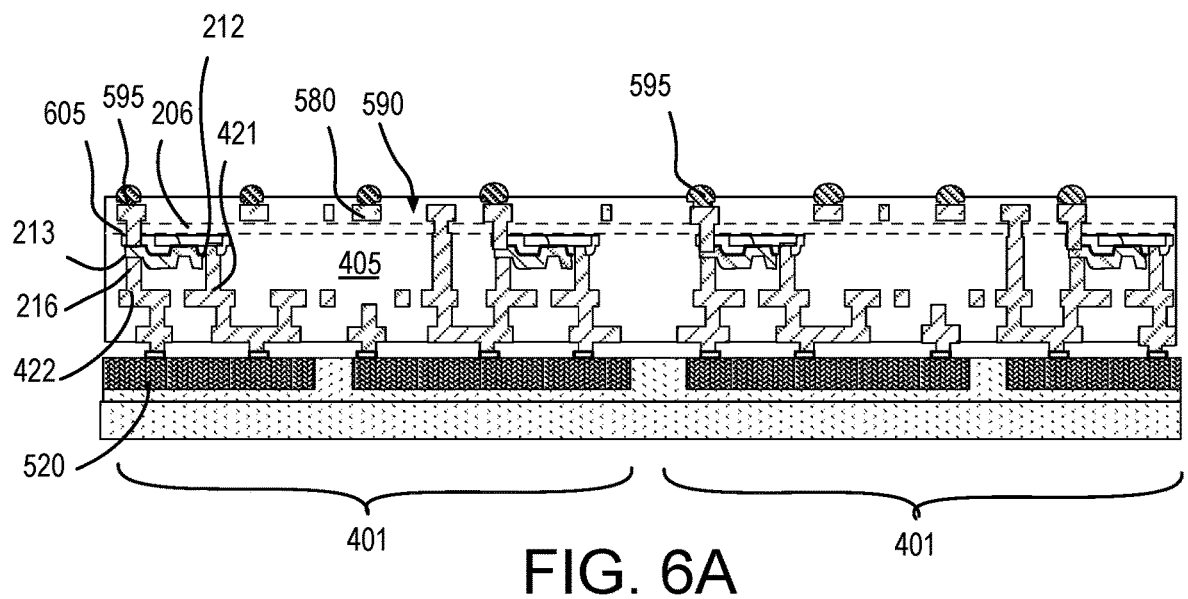
FIGS. 6A, 6B, 6C, and 6D illustrate cross-sectional views through a WLP workpiece illustrating MIM capacitor interconnections, in accordance with some alternative embodiments.
Figure 6B:
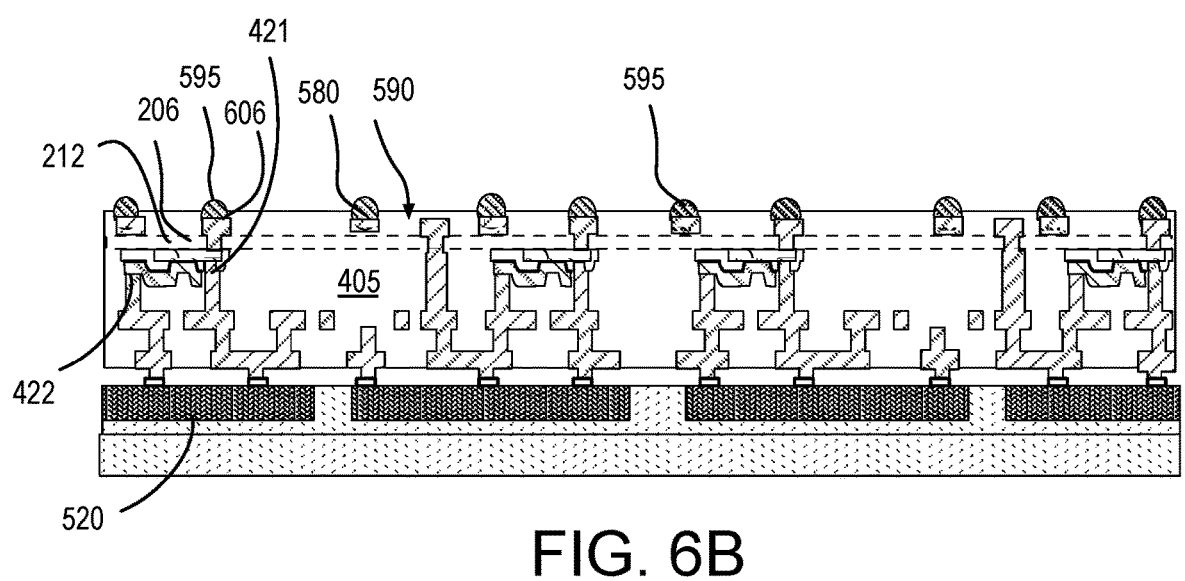

In the example shown in FIG. 6B, capacitor electrode 212 is coupled to an RDL feature 606 that extends through interface layers 206 to couple MIM capacitor electrode 212 with SLI 595. RDL feature 606 may also pass through one or more layers of package dielectric. MIM capacitor electrode 212 is also coupled to IC chip 520 through RDL feature 421. In this example, MIM capacitor electrode 216 is coupled to only one RDL feature 422.

Figure 6C:
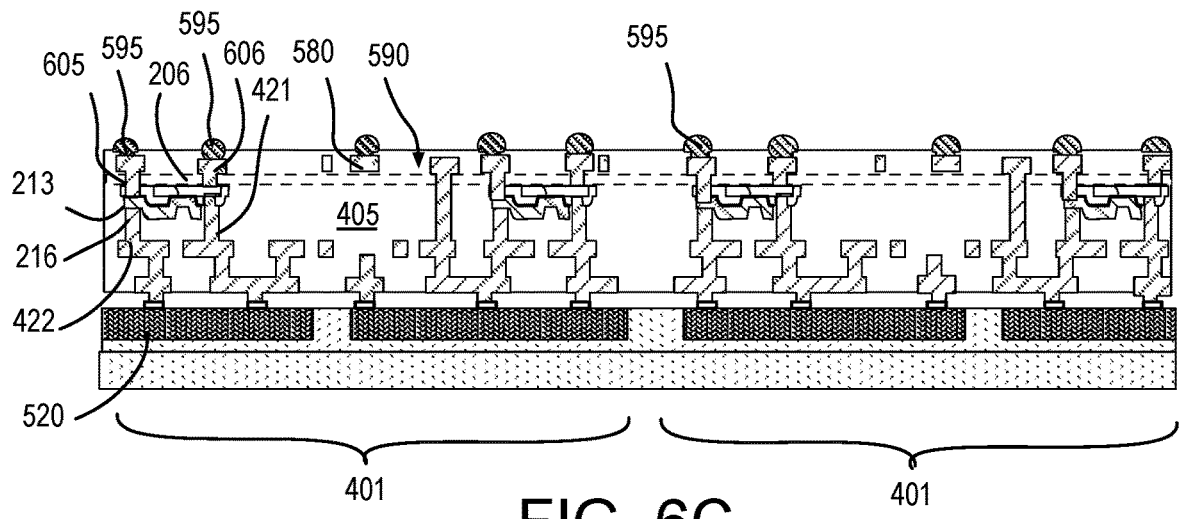

FIG. 6C illustrates an example where both electrodes of a MIM capacitor are coupled to RDL features on opposite sides of the MIM capacitor. The example shown in FIG. 6C illustrates a combination of the embodiments illustrated in FIGS. 6A and 6B with both MIM capacitors electrodes 212 and 216 coupled to first RDL features 421, 422 and also to second RDL features 605, 606, respectively.

Figure 6D:
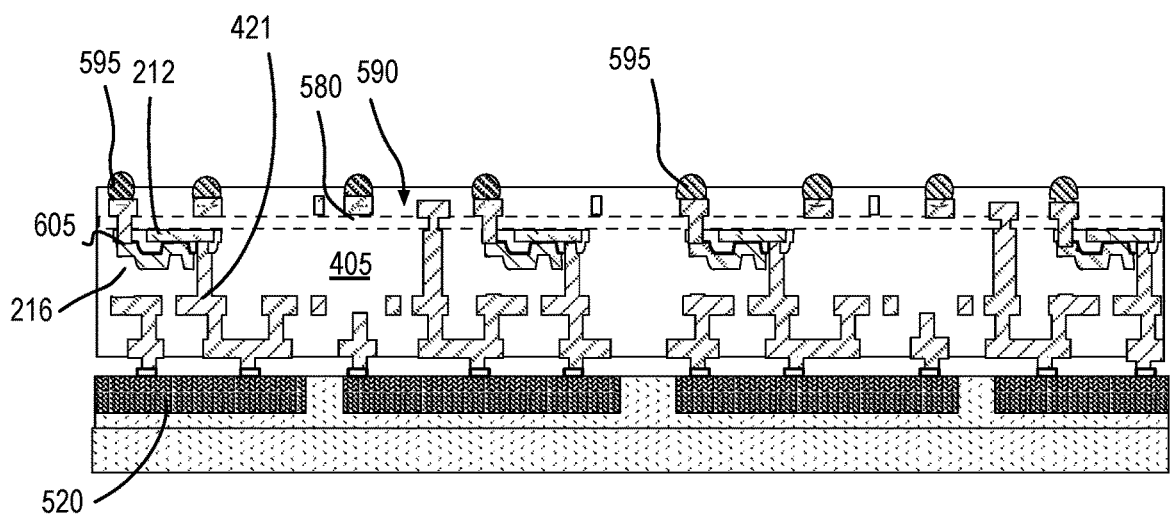

FIG. 6D illustrates an example where a MIM capacitor of a package routing structure is in electrical series between SLI 595 and IC chip 520. Each of MIM capacitor electrodes 212 and 216 are coupled to only one RDL feature. In this example, MIM capacitor electrode 216 is coupled to one RDL feature 605, which terminates at SLI 595. MIM capacitor electrode 212 is likewise coupled to one RDL feature 421, which is further coupled to an IC chip 520. Hence, as illustrated by FIG. 6A-6C each electrode of MIM capacitor may be coupled to one or more RDL features that are located either between the MIM capacitor and an FLI interface, or between the MIM capacitor and a SLI interface. Any permutation of the various examples illustrated may be implemented according to a given implementation.

Figure 7:
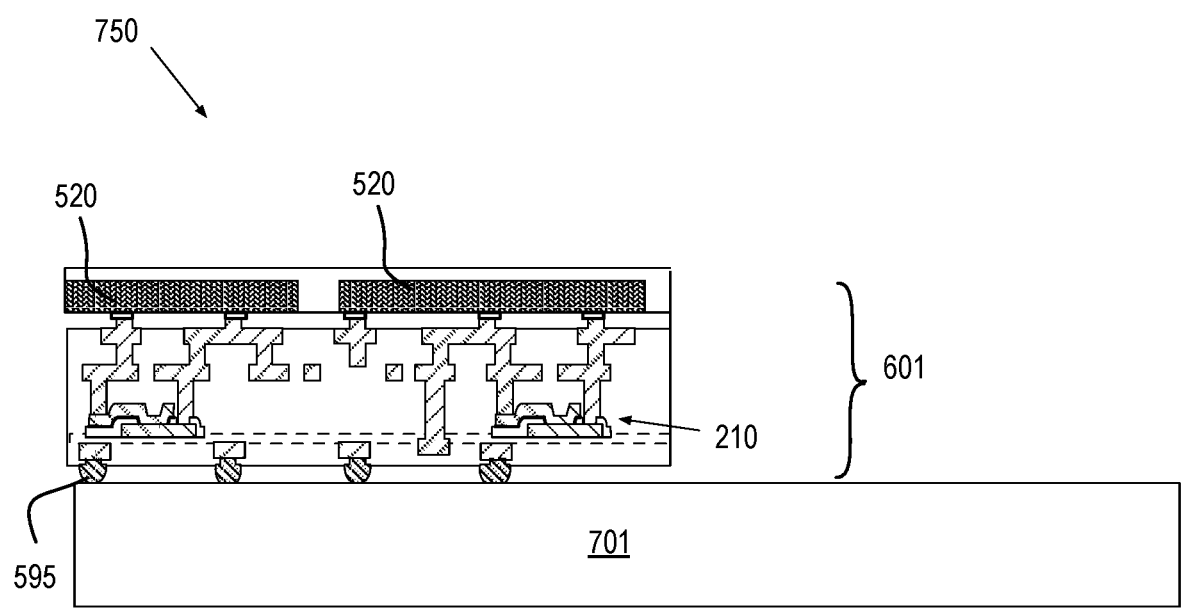
FIG. 7 illustrates a system including an IC chip package interconnected to a host component, in accordance with some embodiments.

IC package routing that integrates a MIM capacitor structure in accordance with one or more of the embodiments described above may be further integrated into a system that includes a host component to which the package routing is attached. FIG. 7 illustrates a system 750 including IC chip package 601 interconnected to a host component 701, in accordance with some embodiments. In some examples, host component 701 is a PCB, for example including one or more interconnect trace levels laminated with one or more glass-reinforced epoxy sheets, such as, but not limited to FR-4. As depicted in FIG. 7, IC package 601 includes IC chip 520, each of which further includes an IC. For some such embodiments, the one or more IC chip 520 includes microprocessor circuitry functional, for example, as a central processing unit, a graphics processing unit, a heterogeneous processor, or the like.

IC package 601 includes a routing structure with conductive redistribution features embedded within a package dielectric and interconnected to each of the IC chip through FLI features. The redistribution features terminate at interfaces that couple the package routing to SLI 595. The routing structure further includes MIM capacitors 210 between the FLI features and the SLI interfaces. As described above, the MIM capacitors 210 include a pair of electrodes separated by an insulator and one or more of the electrodes or insulator has a composition that is different from the conductors and/or dielectrics in other portions of the routing structure. Such distinction in the materials may ensure quality MIM capacitors can be advantageously integrated into routing formed with WLP techniques.

Figure 8:
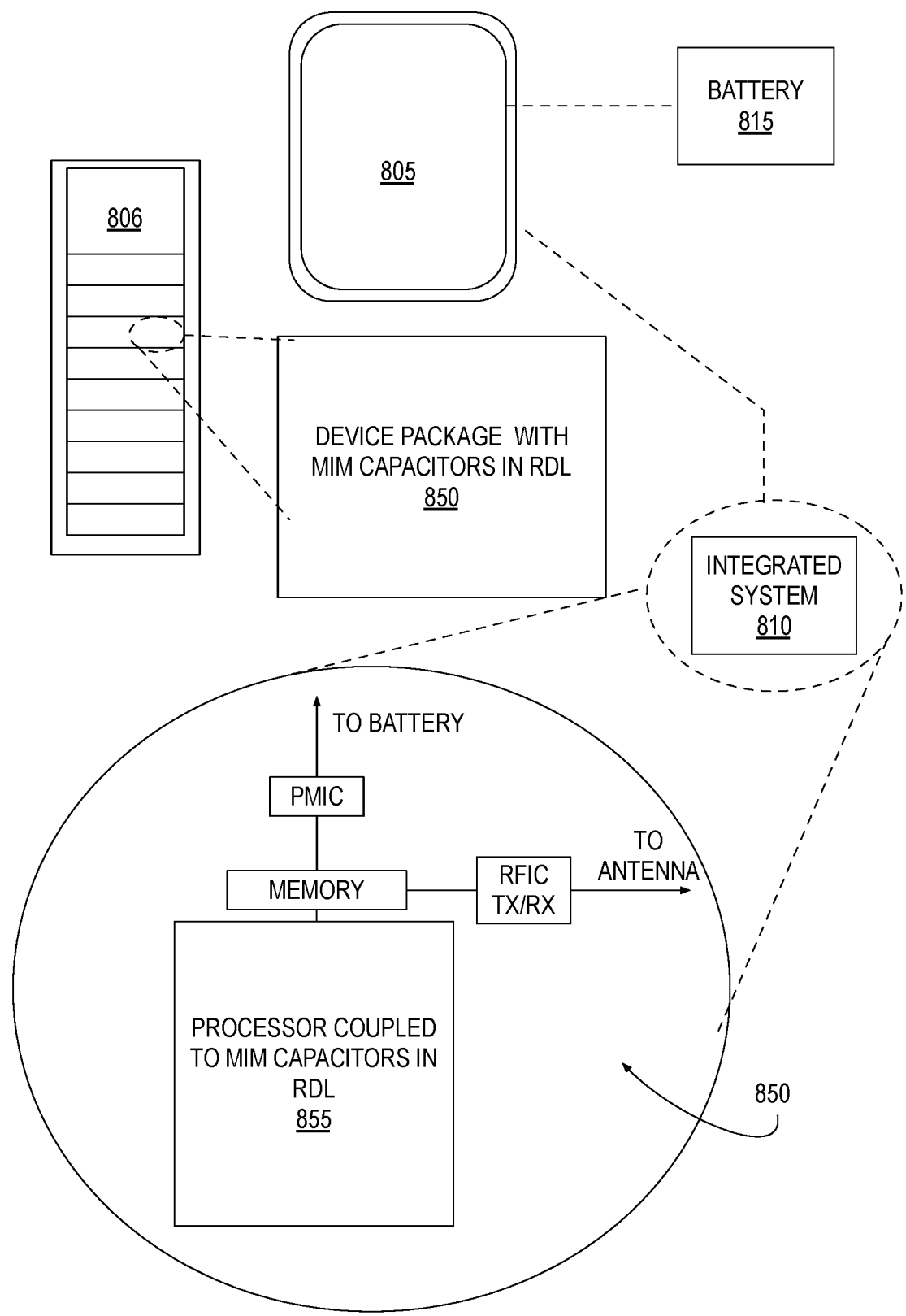
FIG. 8 illustrates a mobile computing platform and a data server machine employing package routing with integrated MIM capacitors, in accordance with embodiments.

FIG. 8 illustrates a mobile computing platform and a data server machine employing package routing with integrated MIM capacitors, for example as described elsewhere herein. The server machine 806 may be any commercial server, for example including any number of high-performance computing platforms disposed within a rack and networked together for electronic data processing, which in the exemplary embodiment includes a packaged monolithic SoC. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

As a system component within the server machine 806, package 850 may include a memory block (e.g., RAM) and a processor block (e.g., a microprocessor, a multi-core microprocessor, baseband processor, or the like) interconnected through an RDL routing structure that further includes MIM capacitors. Package 850 may include one or more of a power management integrated circuit (PMIC), RF (wireless) integrated circuit (RFIC) including a wideband RF (wireless) transmitter and/or receiver (TX/RX), and memory interconnected through an RDL routing structure, which may be further interconnected onto a host board within either server 806 or mobile device 805.

Functionally, a PMIC may perform battery power regulation, DC-to-DC conversion, etc., and may therefore an input coupled to battery 815 and an output providing a current supply to other functional modules. RFIC may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
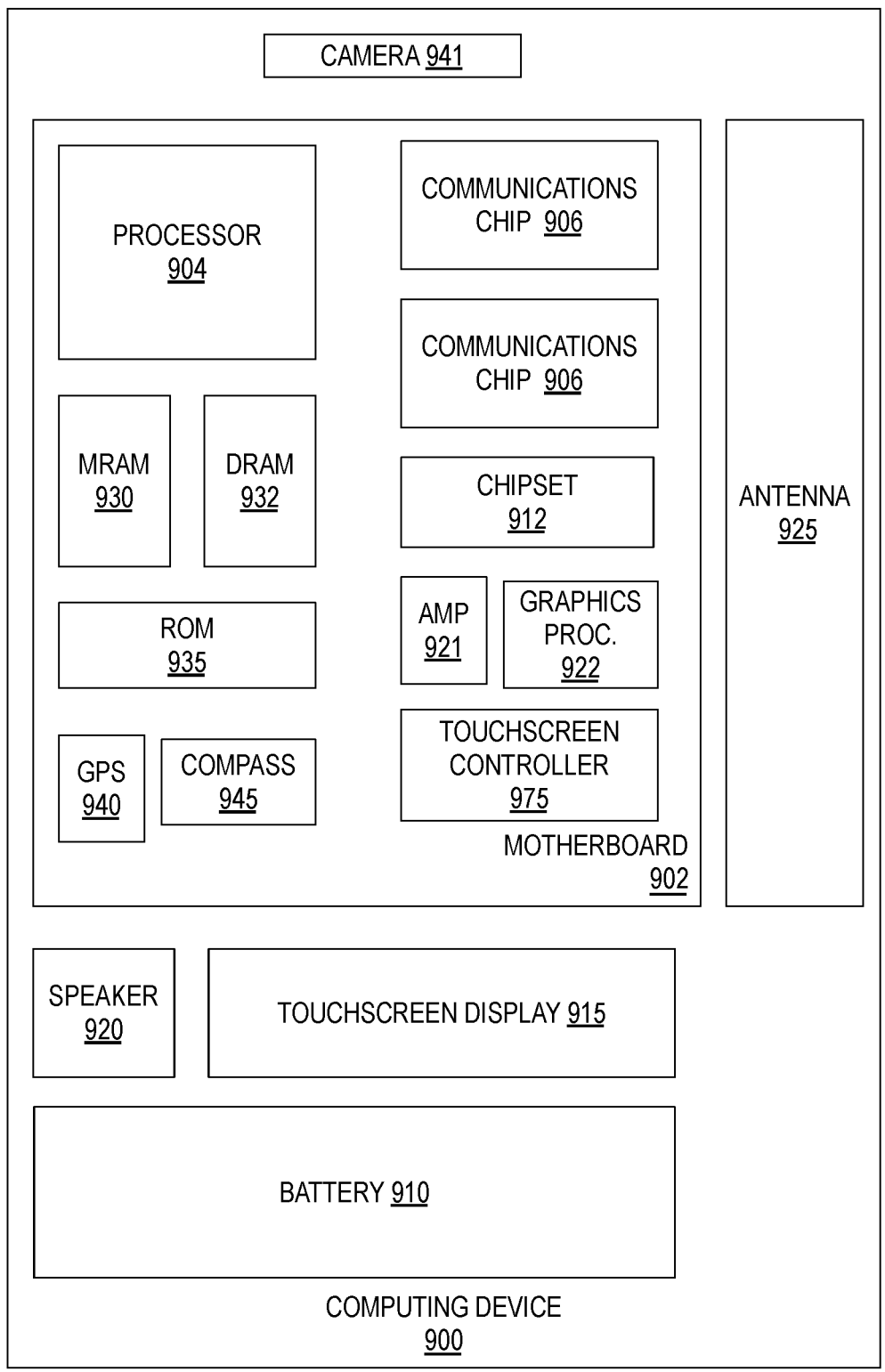
FIG. 9 is a functional block diagram of an electronic computing device, in accordance with some embodiments.

FIG. 9 is a functional block diagram of an electronic computing device, in accordance with some embodiments. Computing device 900 may be found inside platform 805 or server machine 806, for example. Device 900 further includes a motherboard 902 hosting a number of components, such as, but not limited to, a processor 904 (e.g., an applications processor), which may be in a package coupled to motherboard 902 by SLI features, for example as described elsewhere herein. Processor 904 may be physically and/or electrically coupled to motherboard 902. In some examples, processor 904 includes an integrated circuit chip packaged with MIM capacitors coupled to processor 904 through RDL features, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to processor 904 within a PoP assembly. Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like. Any of these other components may also be coupled to motherboard 902, for example by BGA solder connections present on a PoP assembly, for example as described elsewhere herein.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

For example, in first embodiments, a microelectronic device package comprises a chip comprising an integrated circuit (IC), and a routing structure. The routing structure comprises redistribution features interconnected to the chip through first-level interconnect features, wherein the redistribution features are of a first metal composition, and terminate at interfaces that are to couple the package to second-level interconnect features. The routing structure further comprises a metal-insulator-metal (MIM) capacitor structure between the first-level interconnect features and the interfaces, wherein the MIM capacitor structure comprises an electrode of a second metal composition, different than the first metal composition.

In second embodiments, for any of the first embodiments the second metal composition is an alloy of a metal that is substantially absent from the first metal composition.

In third embodiments, for any of the first through second embodiments the first metal composition is predominantly Cu and the second metal composition is predominantly Al.

In fourth embodiments, for any of the first through third embodiments the routing structure comprises a first dielectric material between adjacent ones of the redistribution features, and the MIM capacitor structure comprises a second electrode and an insulator between the electrode and the second electrode, the insulator comprising a second dielectric material of a different composition than the first dielectric material.

In fifth embodiments, for any of the fourth embodiments the insulator comprises a first layer of predominantly silicon and nitrogen between two second layers of predominantly silicon and oxygen.

In sixth embodiments, for any of the fifth embodiments the insulator comprises silicon and at least one of oxygen or nitrogen.

In seventh embodiments, for any of the fourth embodiments the first dielectric material comprises a polymer.

In eighth embodiments, for any of the seventh embodiments the polymer comprises an epoxy or polyimide.

In ninth embodiments, for any of the fourth embodiments the routing structure comprises a third dielectric material in contact with a portion of the electrode, the third dielectric material of a third composition that also comprises silicon.

In tenth embodiments, for any of the first through ninth embodiments the electrode is coupled to one of the first-level interconnect features through a first of the redistribution features, and the MIM comprises a second electrode coupled through a second of the redistribution features to either a second of the first-level interconnect features, or a first of the interfaces.

In eleventh embodiments, for any of the tenth embodiments the package further comprises second-level interconnect features, wherein the second-level interconnect features comprise a solder alloy.

In twelfth embodiments, a system comprises the package of any of the first through eleventh embodiments, and a host component electrically coupled to the interfaces through the second-level interconnect features.

In thirteenth embodiments, a system comprises a plurality of chips, each of the chips comprising an integrated circuit (IC). The system comprises a routing structure. The routing structure comprises redistribution features interconnected to each of the chips through first-level interconnect features, wherein the redistribution features terminate at interfaces that are to couple the package to second-level interconnect features. The routing structure comprises a first dielectric material between adjacent ones of the redistribution features. The routing structure comprises one or more metal-insulator-metal (MIM) capacitor structures between the first-level interconnect features and the interfaces, wherein individual ones of the MIM capacitor structures comprise a pair of electrodes separated by an insulator including a second dielectric material. The second dielectric material is of a composition different than the first dielectric material In fourteenth embodiments, for any of the thirteenth embodiments the first dielectric material comprises a polymer, the second dielectric material comprises a thin film of predominantly silicon and oxygen, the redistribution features comprise predominantly Cu, and the insulator is between two electrodes of an alloy that comprises predominantly other than Cu.

In fifteenth embodiments, for any of the fourteenth embodiments the system comprises a third dielectric material adjacent to an edge of each of the chips, and wherein the first dielectric material and the third dielectric material have substantially the same composition, and wherein the alloy is predominantly Al.

In sixteenth embodiments, for any of the fourteenth through fifteenth embodiments a first of the ICs comprises microprocessor circuitry and a second of the ICs comprises memory circuitry.

In seventeenth embodiments, a method of fabricating a microelectronic package comprises receiving a carrier, and forming, over the carrier, a metal-insulator-metal (MIM) capacitor structure comprising an insulator between two metal electrodes. The method comprises forming a first dielectric material over the MIM capacitor structure. The method comprises forming redistribution features within the first dielectric material, and at least one of the redistribution features is coupled to at least one of the metal electrodes. The method comprises coupling a chip comprising an integrated circuit (IC) to the MIM capacitor through one or more of the redistribution features. The method comprises removing the carrier to expose an interconnect interface of one or more of the metal electrodes or the redistribution features.

In eighteenth embodiments, for any of the seventeenth embodiments forming the MIM capacitor structure further comprises depositing a layer of metal and subtractively patterning the layer of metal into one of the metal electrodes, and depositing, over one of the metal electrodes, a second dielectric material comprising silicon and at least one of oxygen or nitrogen.

In nineteenth embodiments, for any of the seventeenth through eighteenth embodiments depositing the second dielectric material comprises a thermal process exceeding 350° C.

In twentieth embodiments, for any of the eighteenth through nineteenth embodiments depositing the layer of metal comprises depositing an alloy of predominantly Al.

In twenty-first examples, for any of the eighteenth through twentieth embodiments depositing the insulator comprises depositing the second dielectric material comprising predominantly silicon and oxygen, depositing a third dielectric material comprising predominantly silicon and nitrogen over the second dielectric material, and depositing a fourth dielectric material comprising predominantly silicon and oxygen over the third dielectric material.

In twenty-second embodiment, for any of the seventeenth through twenty-first embodiments forming the redistribution features within the first dielectric material further comprises depositing the first dielectric material over the MIM capacitor structure, exposing a portion of at least one of the electrodes by forming an opening in the first dielectric material, and depositing an alloy of predominantly Cu into the opening.

In twenty-third embodiments, for any of the twenty-second embodiments forming the redistribution features within the first dielectric material further comprises apply a liquid comprising a polymer over the carrier, and forming a solid comprising the polymer.

In twenty-fourth embodiments, a method of fabricating a microelectronic system comprises receiving a microelectronic device package, the package comprising a chip comprising an integrated circuit (IC), and a routing structure. The routing structure comprises redistribution features interconnected to the chip through first-level interconnect features, wherein the redistribution features terminate at second-level interconnect interfaces. The routing structure comprises a metal-insulator-metal (MIM) capacitor structure between the first-level interconnect features and the second-level interconnect interfaces. The method comprises coupling the second-level interconnect interfaces to a host component.

It will be recognized that principles of the disclosure are not limited to the embodiments so described, but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A microelectronic device package, comprising:
   a chip comprising an integrated circuit (IC); and
   a routing structure, wherein the routing structure comprises:
      redistribution features interconnected to the chip through first-level interconnect features on a first side of the routing structure, wherein the redistribution features are of a first metal composition that is predominantly Cu, and terminate at interfaces on a second, opposite, side of the routing structure, that are to couple the package to second-level interconnect features; and
      a first dielectric material between adjacent ones of the redistribution features, wherein the first dielectric material comprises a polymer; and
      a metal-insulator-metal (MIM) capacitor structure between the first-level interconnect features and the interfaces, wherein the MIM capacitor structure comprises:
         an electrode and a second electrode, both of a second metal composition, different than the first metal composition; and
         an insulator between the electrode and the second electrode, wherein:
            the insulator comprises a second dielectric material comprising silicon and at least one of oxygen or nitrogen;
            the electrode is coupled to one of the first-level interconnect features through a first of the redistribution features; and
            the second electrode is coupled through a second of the redistribution features to either a second of the first-level interconnect features, or a first of the interfaces.

2. The microelectronic device package of claim 1, wherein the second metal composition is predominantly Al.

3. The microelectronic device package of claim 1, wherein the insulator comprises a first layer of predominantly silicon and nitrogen between two second layers of predominantly silicon and oxygen.

4. The microelectronic device package of claim 1, wherein the insulator comprises silicon and at least one of oxygen or nitrogen.

5. The microelectronic device package of claim 1, wherein the polymer comprises an epoxy or polyimide.

6. The microelectronic device package of claim 1, wherein the routing structure comprises a third dielectric material in contact with a portion of the electrode, the third dielectric material of a third composition that also comprises silicon.

7. The microelectronic device package of claim 1, further comprising the second-level interconnect features, wherein the second-level interconnect features comprise a solder alloy.

8. A system comprising:
the microelectronic device package of claim 7; and
a host component electrically coupled to the interfaces through the second-level interconnect features.

9. The microelectronic device package of claim 1, wherein:
the first dielectric material surrounds the second electrode; and
the routing structure comprises a first via of the first metal composition extending through a portion of the first dielectric material and in direct contact with the second electrode.

10. The microelectronic device package of claim 9, wherein:
the routing structure comprises a second via of the first metal composition extending through a portion of the first dielectric material and in direct contact with the electrode.

11. The microelectronic device package of claim 1, wherein the first dielectric material is in contact with a sidewall of the first electrode.

12. The microelectronic device package of claim 1, further comprising:
a layer of a second dielectric material comprising silicon and at least one of oxygen or nitrogen, the layer of the second dielectric material in contact with a sidewall of the second electrode.

13. The microelectronic device package of claim 12, wherein the insulator is in contact with the electrode within an opening extending through a thickness of the layer of the second dielectric material.

14. The microelectronic device package of claim 13, wherein:
the electrode is in contact with, the insulator; and
a portion of the second electrode within the opening extending through the thickness of the layer of the second dielectric material is spaced apart from the electrode by only a thickness of the insulator.

15. The microelectronic device package of claim 14, wherein the first electrode is substantially planar, and the second electrode comprises a topographic step where the second electrode extends beyond an edge of the first electrode.

16. A system comprising:
a plurality of chips, each of the chips comprising an integrated circuit (IC); and
a routing structure, wherein the routing structure comprises:
redistribution features comprising predominantly Cu interconnected to each of the chips through first-level interconnect features on a first side of the routing structure, wherein the redistribution features terminate at interfaces on a second, opposite, side of the routing structure that are to couple the chips to second-level interconnect features;
a first dielectric material between adjacent ones of the redistribution features wherein the first dielectric material comprises an epoxy or polyimide; and
one or more metal-insulator-metal (MIM) capacitor structures between the first-level interconnect features and the interfaces, wherein individual ones of the MIM capacitor structures comprise a pair of electrodes, both comprising predominantly other than Cu separated by an insulator including a second dielectric material comprising predominantly silicon and at least one of oxygen or nitrogen.

17. The system of claim 16, wherein
the second dielectric material comprises a thin film of predominantly silicon and oxygen.

18. The system of claim 17, further comprising a third dielectric material adjacent to an edge of each of the chips, and wherein the first dielectric material and the third dielectric material have substantially the same composition, and wherein the pair of electrodes are both predominantly Al.

19. The system of claim 16, wherein:
the first dielectric material surrounds the pair of electrodes; and
the redistribution features comprise:
a first via of predominantly Cu extending through a portion of the first dielectric material and in direct contact with a first of the pair of electrodes; and
a second via of predominantly Cu extending through a portion of the first dielectric material and in direct contact with a second of the pair of electrodes.

20. The system of claim 19, wherein:
the first dielectric material surrounds the pair of electrodes, and is in contact with a sidewall of the second of the pair of electrodes;
a layer of a third dielectric material comprising silicon and at least one of oxygen or nitrogen is in contact with a sidewall of the first of the pair of electrodes; and
a portion of second dielectric material within an opening extending through a thickness of the layer of the second dielectric material is in contact with the first of the pair of electrodes.

21. A system comprising:
a plurality of chips, each of the chips comprising an integrated circuit (IC); and
a routing structure, wherein the routing structure comprises:
first redistribution features interconnected to each of the chips on a first side of the routing structure;
second redistribution features on a second, opposite, side of the routing structure that are to electrically couple the routing structure to a host component, wherein the first and second redistribution features are of a first metal composition;
a first dielectric material between adjacent ones of the first and second redistribution features, wherein the first dielectric material is an organic dielectric; and
one or more metal-insulator-metal (MIM) capacitor structures between the first redistribution features and the second redistribution features, wherein individual ones of the MIM capacitor structures comprise a pair of electrodes of a second metal composition, different than the first metal composition, separated by an insulator including a second dielectric material comprising predominantly silicon and at least one of oxygen or nitrogen, and wherein the MIM capacitor structure comprises an electrode of a second metal composition, different than the first metal composition.

22. The system of claim 21, wherein:
the first dielectric material comprises an epoxy or polyimide; and
the second dielectric material comprises a thin film of predominantly silicon and oxygen.

23. The system of claim 21, wherein the first metal composition is predominantly Cu and the second metal composition is predominantly Al.

* * * * *